United States Patent
Ruigrok (10) Patent No.: US 8,202,635 B2
(45) Date of Patent: Jun. 19, 2012

(54) MAGNETIC ROM INFORMATION CARRIER WITH ADDITIONAL STABILIZING LAYER

(75) Inventor: Jaap Ruigrok, Asten (NL)

(73) Assignee: NXP B.V., Eindhoven (NL)

(*) Notice: Subject to any disclaimer, the term of this patent is extended or adjusted under 35 U.S.C. 154(b) by 398 days.

(21) Appl. No.: 11/814,675

(22) PCT Filed: Jan. 19, 2006

(86) PCT No.: PCT/IB2006/050204
§ 371 (c)(1),
(2), (4) Date: May 16, 2008

(87) PCT Pub. No.: WO2006/077549
PCT Pub. Date: Jul. 27, 2006

(65) Prior Publication Data
US 2009/0009908 A1    Jan. 8, 2009

(30) Foreign Application Priority Data
Jan. 24, 2005 (EP) .................................. 05100424

(51) Int. Cl.
*G11B 5/64* (2006.01)
*G11B 5/66* (2006.01)
*G11B 5/667* (2006.01)
(52) U.S. Cl. ..... 428/800; 428/816; 428/827; 428/693.1; 365/97; 365/173
(58) Field of Classification Search ................. None
See application file for complete search history.

(56) References Cited

U.S. PATENT DOCUMENTS

| 4,281,396 A | * | 7/1981 | Roos | 365/29 |
| 5,995,309 A | * | 11/1999 | Suzuki et al. | 360/55 |
| 6,043,947 A | * | 3/2000 | Gooch et al. | 360/318 |
| 6,510,015 B2 | * | 1/2003 | Sacks et al. | 360/75 |

(Continued)

FOREIGN PATENT DOCUMENTS

WO    2004032149 A1    4/2004

OTHER PUBLICATIONS

Derwent Abstract Translation of WO 2004/032145 A1 (Derwent Acc-No. 2004-316606) (Apr. 2004).*

*Primary Examiner* — Kevin Bernatz (57) ABSTRACT

The invention relates to a read only magnetic information carrier (1b, 1c, 1d) comprising a substrate (2), an information layer (3) and a stabilizing layer (15a, 15b). The information layer (3) comprises a pattern of magnetic bits (4) of magnetic material wherein the pattern of magnetic bits (4) constitutes an array of bit locations. The presence or absence of the magnetic material at a bit location represents a value of the bit location by a magnetic field (5) having a predetermined magnetization direction (6). The stabilizing layer (15a, 15b) is arranged between the substrate (2) and the information layer (3) and comprises hard magnetic material (8, 9) which is magnetically coupled to the magnetic material of the magnetic bit (4). The magnetically coupled hard magnetic material (8, 9) provides the predetermined magnetization direction (6) of the magnetic field (5). The magnetic coupling between the hard magnetic material (8, 9) and the magnetic bits (4) prevents the predetermined magnetization direction (6) of the magnetized material of the magnetic bits (4) to change, which improves the thermal stability of the magnetic bits (4).

12 Claims, 5 Drawing Sheets

U.S. PATENT DOCUMENTS

| | | | |
|---|---|---|---|
| 6,723,457 B2 * | 4/2004 | Tanahashi et al. | 428/828 |
| 7,531,249 B2 * | 5/2009 | Oikawa | 428/829 |
| 7,715,137 B2 * | 5/2010 | Albrecht et al. | 360/48 |
| 2002/0006058 A1 * | 1/2002 | Nakajima et al. | 365/171 |
| 2002/0064689 A1 | 5/2002 | Yamanaka et al. | |
| 2003/0138671 A1 | 7/2003 | Oikawa et al. | |
| 2003/0232218 A1 * | 12/2003 | Sato et al. | 428/694 T |
| 2004/0229083 A1 * | 11/2004 | Maeda et al. | 428/694 T |
| 2005/0045913 A1 * | 3/2005 | Nguyen et al. | 257/200 |
| 2005/0225890 A1 * | 10/2005 | Sakurai et al. | 360/48 |
| 2005/0281081 A1 * | 12/2005 | Fullerton et al. | 365/173 |
| 2006/0028748 A1 * | 2/2006 | Coehoorn | 360/31 |
| 2006/0105205 A1 * | 5/2006 | van de Veerdonk et al. | 428/836 |
| 2006/0176599 A1 * | 8/2006 | Semba | 360/51 |
| 2007/0058422 A1 * | 3/2007 | Phillips et al. | 365/158 |
| 2007/0164264 A1 * | 7/2007 | Lenssen et al. | 257/1 |

* cited by examiner

MAGNETIC ROM INFORMATION CARRIER WITH ADDITIONAL STABILIZING LAYER

The invention relates to a read only magnetic information carrier comprising a substrate, and an information layer comprising a pattern of magnetic bits of magnetic material, the pattern of magnetic bits constituting an array of bit locations wherein the presence or absence of the magnetic material at a bit location represents a value of the bit location by a magnetic field having a predetermined magnetic field direction.

The invention further relates to a storage device and a method of manufacturing the read only magnetic information carrier.

Read only magnetic information carriers are, for example, disclosed in WO 2004/032149. In this document a storage device is disclosed comprising an information carrier part and a read-out part. The information carrier part comprises an information plane for cooperating with a read-out part. The information plane comprises a pattern of electro-magnetic material which constitutes an array of bit locations. The presence or absence of said material at the information plane represents a logical value. In a first bit location the material is present, for example, indicating the logical value 1, and in a second bit location the material is absent, for example, indicating the logical value 0. In a specific embodiment of the information carrier disclosed in WO 2004/032149, the electromagnetic material which represents a bit at a bit location is an isolated bit of hard magnetic material. The pattern of isolated bits of hard magnetic material is permanently magnetized in an external magnetic field, creating a pattern of magnetized magnetic bits all substantially having the same predetermined magnetic field direction comprising a magnetic field strength. The read-out part comprises electromagnetic sensor elements which are sensitive to the presence of said electromagnetic material. The read-out is done via a resistance measurement which relies on a magnetoresistance phenomenon. The resistance in the sensor element is influenced by a nearby magnetic field. At a bit location of the information carrier part where a magnetized bit is present, the magnetic bit provides a magnetic field substantially having the predetermined magnetic field direction and a magnetic field strength to the sensor element resulting in a first sensed resistance. At a bit location of the information carrier part where no magnetic bit is present, the sensor element senses a different magnetic field strength, resulting in a second sensed resistance, which is different from the first sensed resistance. When measuring the resistance of the sensor element at each of the bit locations, the logical value of each of the bit locations can be determined.

To increase the data density on a read only magnetic information carrier the dimensions of the magnetic bits must be reduced. A problem of the known read only magnetic information carrier is that when reducing the dimensions of the magnetized magnetic bits, the magnetized magnetic bits become unstable which results in a reduced data reliability or even loss of data.

It is an object of the invention to provide a magnetic information carrier wherein the magnetic bits have improved stability.

According to a first aspect of the invention the object is achieved with an information carrier as defined in the opening paragraph, wherein the read only magnetic information carrier further comprises a stabilizing layer between the substrate and the information layer, the stabilizing layer comprising hard magnetic material being magnetically coupled to the magnetic material of the magnetic bits for providing the predetermined magnetic field direction of the magnetic field. In this application a hard magnetic material is defined as a permanent magnetic material. A hard magnetic material generally has a relative high coercive field. The permeability is generally relatively low.

According to a second aspect of the invention, the object is achieved with a storage device as defined in the opening paragraph, wherein the storage device comprises a read-out part and the read only magnetic information carrier, wherein the read-out part comprising a sensor for sensing the presence or absence of magnetic material at a bit location by the magnetic field having the predetermined magnetic field direction.

The effect of the measures according to the invention is that the magnetic coupling, also known as exchange coupling, between the hard magnetic material in the stabilizing layer and the magnetic bits provides the magnetic field substantially having the predetermined magnetic field direction to the magnetic bits. Furthermore, the magnetic coupling prevents a magnetization direction of the magnetized material of the magnetic bits to change, which secures the predetermined magnetic field direction of the magnetic field provided by the magnetic bits, and improves the stability of the magnetic bits.

The invention is based on the recognition that the stability of a magnetic bit depends on a bit volume of the magnetic bit, on a material parameter (being the anisotropy energy density) of the magnetized magnetic material of the magnetic bit and on the temperature of the magnetic bit. When the dimensions of the magnetic bits are reduced beyond a specific volume (the specific volume being dependent on the material parameter and on the temperature), the magnetization direction of the magnetic bits becomes unstable and may change. This is called the superparamagnetic effect. The superparamagnetic effect also causes the magnetic field direction of the magnetic field provided by the magnetic bit to change. When applying the stabilizing layer, the magnetic coupling between the magnetic bits and the hard magnetic material in the stabilizing layer artificially increases the bit volume of the magnetic bit, which results in an increased stability of the magnetic bits. The increased stability enables a reduction of the dimensions of the magnetic bits while maintaining stability of the magnetic field direction of the magnetic field provided by the magnetic bit.

According to a third aspect of the invention the object is achieved with a method of manufacturing the read only magnetic information carrier as defined in the opening paragraph, wherein the method of manufacturing comprises the steps of applying a layer of hard magnetic material to a substrate for constituting the stabilizing layer, applying a pattern of magnetic bits of magnetic material to the layer of hard magnetic material, heating the hard magnetic material for achieving a paramagnetic state, providing an external magnetic field according to the predetermined magnetization direction, and cooling the hard magnetic material in the presence of the magnetic field for achieving a hard magnetic state.

The effect of the method of manufacturing the read only magnetic information carrier is that the magnetization direction of the hard magnetic layer is coupled by heating the hard magnetic layer to achieve the paramagnetic state. The external magnetic field, which is provided to the read only magnetic information carrier, magnetically couples the magnetization direction of the magnetic bits to the hard magnetic material in the stabilizing layer. By reducing the temperature of the hard magnetic material, the hard magnetic material returns to the hard magnetic state, securing the magnetic coupling between the magnetic bits and the hard magnetic material in the stabilizing layer.

The magnetic bits of the read only magnetic information carrier provide a magnetic field having a predetermined magnetic field direction. The magnetic material of the magnetic bits is magnetically coupled with the hard magnetic material in the stabilizing layer. This coupling between the magnetic bits and the hard magnetic material can be achieved by aligning the magnetization direction of both the magnetic bits and the hard magnetic material through an external field while the hard magnetic material is in the paramagnetic state and cooling down. The external field determines the predetermined magnetic field direction of the magnetic field provided by the magnetic bits after the read only magnetic information carrier has been produced.

In an embodiment of the read only magnetic information carrier, the magnetic bits are constituted by magnetized hard magnetic material and the hard magnetic material in the stabilizing layer is constituted by anti-ferromagnetic material, the coupling between the magnetic material of the magnetic bit and the anti-ferromagnetic material being ferromagnetic or anti-ferromagnetic. The magnetic bits are magnetically coupled to local material domains of the anti-ferromagnetic material. Depending on the type of hard magnetic material used in the magnetic bits in combination with the type of anti-ferromagnetic material used in the stabilizing layer, the coupling between the magnetic bits and the anti-ferromagnetic material domains is a ferromagnetic coupling or an anti-ferromagnetic coupling. The magnetic coupling between the magnetic bits and the local material domains secures the magnetization direction of the magnetic bits which secures the magnetic field direction of the magnetic field provided by the magnetic bits, thus improving the stability of the magnetic bits.

A benefit when using a stabilizing layer constituted by anti-ferromagnetic material is that the anti-ferromagnetic material does not comprise a macroscopic magnetic field. A further benefit when using a stabilizing layer which is constituted by anti-ferromagnetic material is that the stabilizing layer does not comprise local magnetic fields due to material non-uniformities or due to local magnetic domains. Therefore, the information carrier comprises less medium noise (being background noise and/or offsets in the sensed magnetic field).

In an embodiment of the read only magnetic information carrier, the hard magnetic material in the stabilizing layer is constituted by magnetized ferromagnetic material. The magnetic bits are magnetically coupled to the magnetized ferromagnetic material. The magnetized ferromagnetic material secures the magnetization direction of the magnetic bits, which secures the magnetic field direction of the magnetic field provided by the magnetic bits, improving the stability of the magnetic bits.

In an embodiment of the read only magnetic information carrier, the stabilizing layer is constituted by magnetized ferromagnetic material and the magnetic bit is constituted by soft magnetic material. The exchange coupling between the soft magnetic material and the ferromagnetic material in the stabilizing layer secures the magnetization direction in the soft magnetic material for providing the magnetic field having the predetermined magnetic field direction. The soft magnetic bits are magnetized by the magnetized ferromagnetic material of the stabilizing layer and respond by producing their own magnetic field having the predetermined magnetic field direction. The stability of the magnetic bit is determined by the stability of the magnetized ferromagnetic material in the stabilizing layer.

An additional benefit when using soft magnetic bits is that the pattern of magnetic bits can be directly applied to the magnetized ferromagnetic material. The soft magnetic material transfers the magnetization direction of the magnetized ferromagnetic material to the information layer without having to magnetize the pattern of soft magnetic bits by an external magnetic field. As a result of the magnetization of the soft magnetic material, a magnetic field is provided having the predetermined magnetic field direction.

In an embodiment of the method of manufacturing the read only magnetic information carrier, the pattern of magnetic bits comprises soft magnetic material, the hard magnetic material in the stabilizing layer comprises ferromagnetic material and the step of applying the pattern of magnetic bits of magnetic material to the layer of hard magnetic material is performed after the step of cooling the hard magnetic material in the presence of the magnetic field. The magnetization of the ferromagnetic material in the stabilizing layer is realized first after which the pattern comprising soft magnetic material is applied. The soft magnetic material is magnetized via the magnetic coupling with the magnetized ferromagnetic material in the stabilizing layer and provides the magnetic field comprising the predetermined magnetic field direction.

In an embodiment of the method of manufacturing the read only magnetic information carrier, the pattern of magnetic bits comprises hard magnetic material and the step of heating the hard magnetic material comprises heating both the hard magnetic material in the stabilizing layer and hard magnetic material constituting the pattern of magnetic bits for achieving the paramagnetic state. Because both the hard magnetic material in the stabilizing layer and the hard magnetic material in the magnetic bits are heated for achieving the paramagnetic state, they are both magnetized during the cooling down in the presence of the applied external magnetic field.

These and other aspects of the invention are apparent from and will be elucidated with reference to the embodiments described hereinafter.

Figure 1:
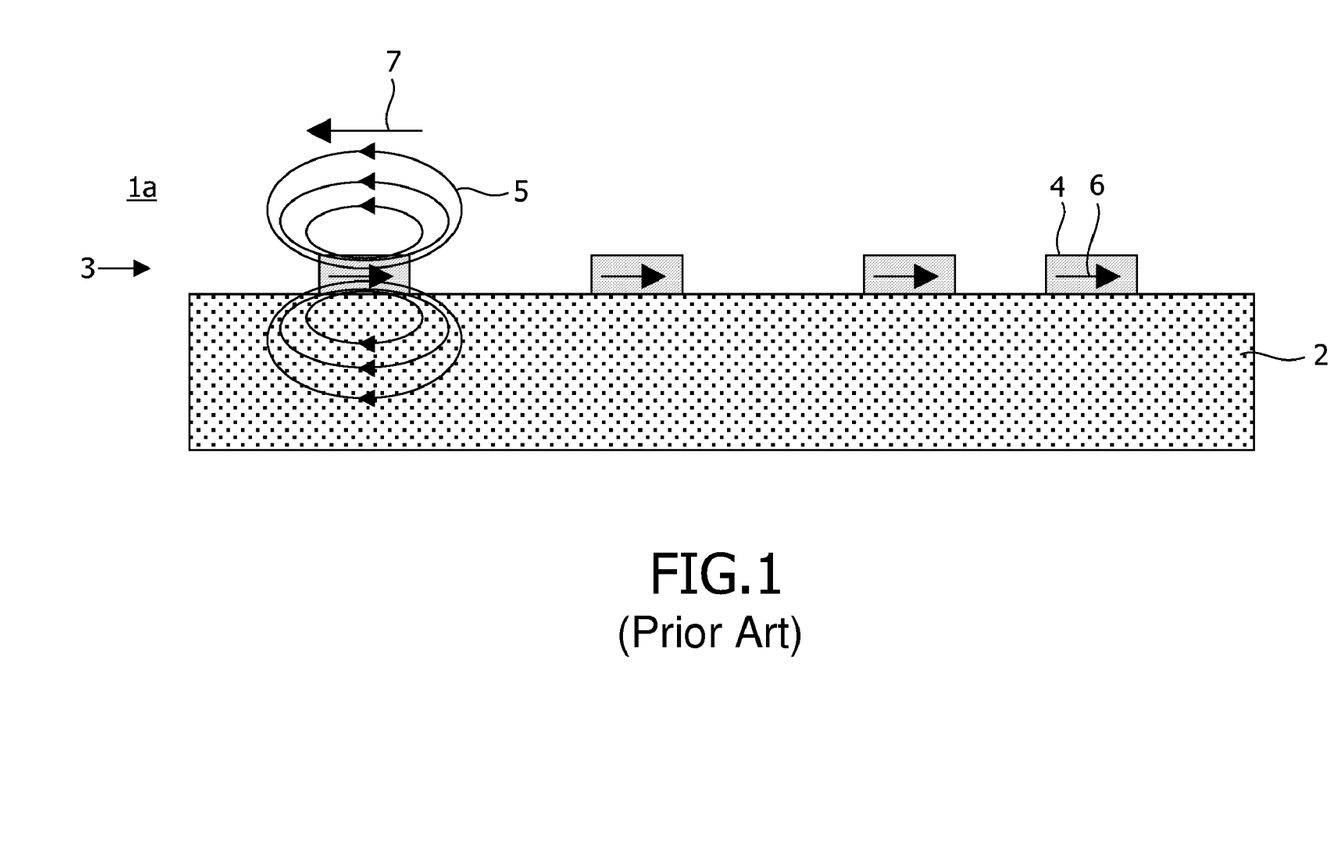
FIG. 1 shows the read only magnetic information carrier according to the prior art.

FIG. 1 shows the read only magnetic information carrier 1*a* according to the prior art. The read only magnetic information carrier 1*a* comprises a substrate 2, and an information layer 3. The information layer 3 comprises a pattern of magnetic bits 4 constituted by magnetized magnetic material, wherein each magnetic bit 4 comprises a magnetization direction 6. The pattern of magnetic bits 4 constitutes an array of bit locations wherein the presence or absence of the magnetized magnetic material at a bit location represents a value of the bit location. The value of the bit location is determined by a magnetic field 5 having a predetermined magnetic field direction 7 which results from the magnetization direction 6 of the magnetic bits 4.

The stability of the magnetization direction 6 of a magnetic bit 4 depends on a barrier energy ($E_{barrier}$). The barrier energy ($E_{barrier}$) defines an energy threshold which must be overcome before the magnetization direction 6 of a magnetic bit 4 changes. The barrier energy ($E_{barrier}$) depends on a bit volume (V) and on a material parameter (K) of the magnetic material. The bit volume (V) is the volume of magnetic material which constitutes the magnetic bit 4. The material parameter (K) is expressed in a so called anisotropy energy density. When reducing the size of the magnetic bit 4, the bit volume (V) is reduced, which reduces the barrier energy ($E_{barrier}$). When the barrier energy ($E_{barrier}$) of the magnetic bit 4, for example, approaches a thermal energy ($E_{thermal}$~kT, where k is the Boltzmann constant and T is the temperature) of the magnetized magnetic bit 4, the magnetic bit 4 becomes unstable. Thermally unstable magnetic bits randomly change their magnetization direction. For magnetic bits to be stable for years, the barrier energy must be about 40 times larger than the thermal energy ($E_{barrier} \geq 40*E_{thermal}$, being equivalent to: $KV \geq 40*kT$).

In the read only magnetic information carrier 1a as shown in FIG. 1 each magnetic bit 4 provides the magnetic field 5 having substantially the same predetermined magnetic field direction 7. When the dimensions of the magnetic bits 4 are reduced such that the barrier energy ($E_{barrier}$) of the magnetic bit 4 is close to or below 40 times the thermal energy ($E_{thermal}$) of the magnetic bit 4, the magnetization direction 6 of the magnetic bit 4 becomes unstable and thus the magnetic field direction 7 of the magnetic field 5 becomes unstable. This effect is called the superparamagnetic effect and limits the data-density on magnetic information carriers 1a.

The array of bit locations, for example, is a one or two dimensional array of bit locations in which a pattern of magnetic bits 4 represents the information stored on the read only magnetic information carrier 1a. The one or two dimensional array of bit locations may, for example, be read by a one or two dimensional array of sensors (not shown), statically or dynamically. See WO 2004/032149 for details. The one or two dimensional array of bit locations may also, for example, be read by scanning a sensor 21 (see FIG. 4) across the array of bit locations. The array of bit locations may, for example, also be a one dimensional track of data which is sequentially scanned by a sensor 21 in which, for example, the read only magnetic information carrier and the sensor 21 move relative to each other.

Figure 2:
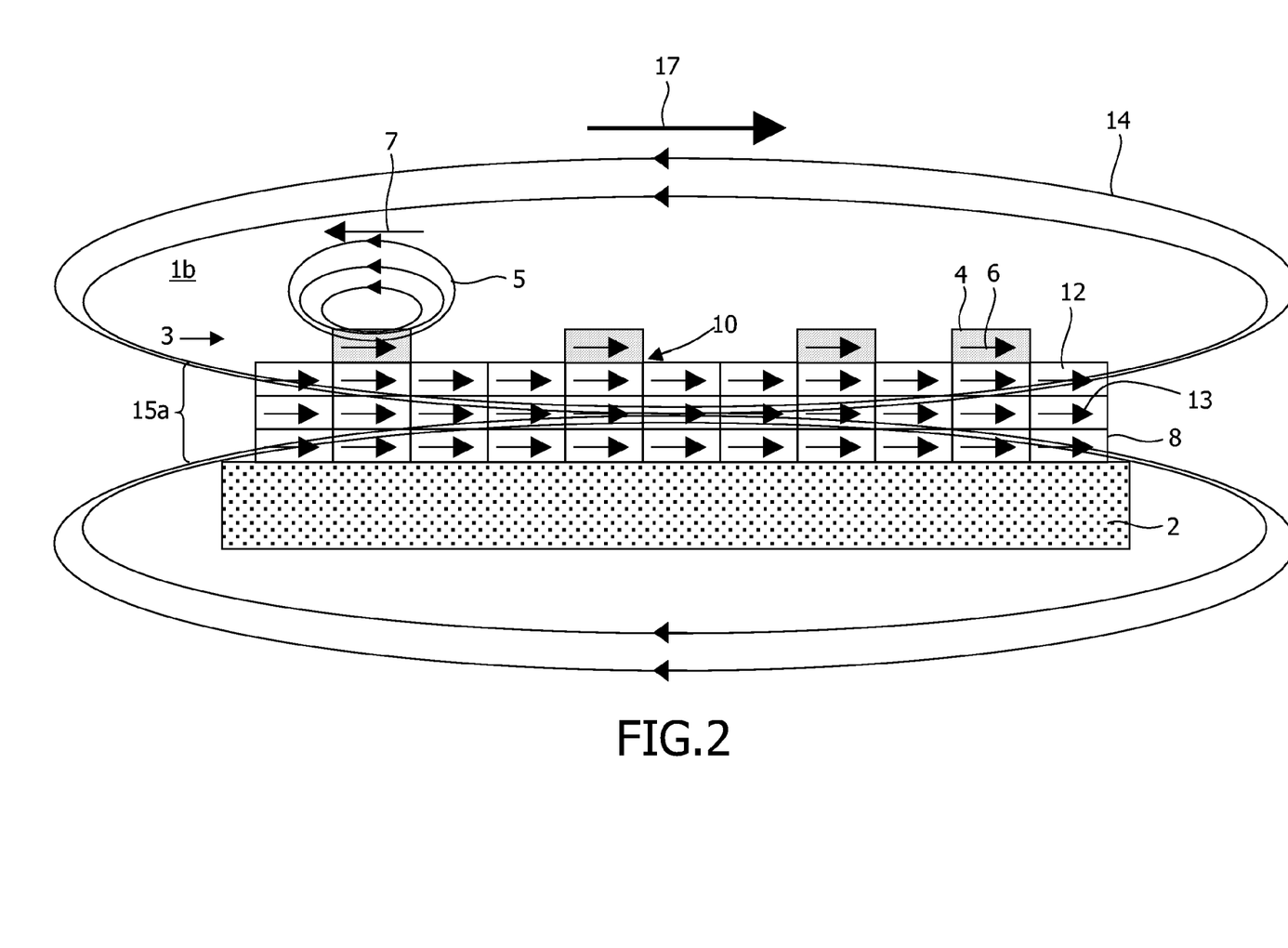
FIG. 2 shows the read only magnetic information carrier according to the invention having a stabilizing layer which is constituted by magnetized ferromagnetic material.

FIG. 2 shows a simplified representation of the read only magnetic information carrier 1b according to the invention having a stabilizing layer 15a which is constituted by magnetized ferromagnetic material 8. Ferromagnetic material 8 is constituted by so called material domains 12, wherein each material domain 12 comprises a small volume of magnetized ferromagnetic material 8 which comprises a domain magnetization direction 13 resulting in a domain magnetic field (not shown). When the layer of ferromagnetic material 8 has not been magnetized, the domain magnetic fields resulting from the domain magnetization directions 13 of the material domains 12 in the ferromagnetic material 8 substantially compensate each other which results in a layer of ferromagnetic material 8 which is substantially magnetically neutral (not shown).

The stabilizing layer 15a of FIG. 2 is constituted by ferromagnetic material 8 which has been magnetized wherein the domain magnetization directions 13 of the material domains 12 are substantially aligned parallel to the magnetization direction 6 of the magnetic bits 4. This results in a stabilizing layer 15a which comprises a macroscopic magnetic field 14 substantially parallel to the predetermined magnetic field direction 7 of the magnetic field 5 of the magnetic bits 4. The ferromagnetic material 8 in the stabilizing layer 15a, for example, is a continuous layer in the stabilizing layer 15a, or, for example, is only present in a stabilizing pattern (not shown) at the locations where magnetic bits 4 are present in the information layer 3. The functional effect of the ferromagnetic material 8 is that it is magnetically coupled to the magnetic bits 4 and that the artificial increase in bit volume due to the magnetic coupling 10 (resulting in an effective bit volume) is sufficient to increase the stability. Typical values for a hard ferromagnetic material is a coercive field $H_C$>>800 A/m, while for a soft magnetic material (only magnetic in the presence of a magnetic field) typically $H_C$<800 A/m.

The magnetic bits 4 which are coupled to the ferromagnetic material 8 in the stabilizing layer 15a comprise hard magnetic material or soft magnetic material. When the magnetic bits 4 are constituted by hard magnetic material, the hard magnetic material of the magnetic bits 4 must be magnetized, for example, by an external magnetic field, resulting in a magnetization direction 6 of the magnetic bits 4. The material domains 12 which are coupled to the magnetic bits 4 comprise domain magnetization direction 13 substantially parallel to the magnetization direction 6 of the magnetic bit 4. The magnetic coupling between the ferromagnetic material 8 and the magnetic bits 4 secures the magnetization direction 6 of the magnetic bit 4, which increases the stability of the magnetization direction 6 of the magnetic bit 4. The magnetization direction 6 of the magnetic bit 4 is secured because the magnetic coupling between the magnetic bit 4 and the ferromagnetic material 8 artificially increases the bit volume of the magnetic bit 4 and thus artificially increases the barrier energy of the magnetic bits 4. Due to the increased barrier energy of the coupled magnetic bits 4, more energy must be overcome before the magnetization direction 6 of the magnetic bit 4 changes. Because of this increased threshold, the stability of the magnetization direction 6 of the magnetic bits 4 is increased. Because of its higher coercive field, a hard ferromagnetic bit will have a remanence magnetization in the absence of an applied magnetic field, whereas a soft ferromagnetic bit will be demagnetized.

When the magnetic bits 4 are constituted by soft magnetic material, the material domains 12 in the magnetized ferromagnetic material 8 which are coupled to the magnetic bits 4 via an exchange coupling, secure their domain magnetization directions 13 to the soft magnetic material. The soft magnetic material transfers the domain magnetization direction 13 from the stabilizing layer 15a to the information layer 3 and provides the magnetic field 5 having the predetermined magnetic field direction 7, comparable to the magnetic bits 4 comprising hard magnetic material. However, in contrast with the magnetic bits 4 comprising hard magnetic material, the magnetic bits 4 comprising soft magnetic material do not need to be magnetized before providing the magnetic field 5 having the predetermined magnetic field direction 7. The magnetized ferromagnetic material 8 provides the domain magnetization directions 13 to the soft magnetic material, which responds by providing the magnetic field 5 having the predefined magnetic field direction 7. The stability of the magnetic field 5 provided by the soft magnetic material is determined by the stability of the magnetized ferromagnetic material 8 in the stabilizing layer 15a.

The logical value of a bit location in the read only information carrier 1b as shown in FIG. 2 is determined by the presence or absence of the magnetized magnetic material which provides the magnetic field 5. Therefore, the logical value of a bit location is defined by a difference in a sensed magnetic field by a sensor 21 (FIG. 4) between a bit location with magnetized magnetic material present and a bit location without magnetized magnetic material present. Due to the presence of the magnetized ferromagnetic material 8 in the stabilizing layer 15a the macroscopic magnetic field 14 is present at the read only information carrier 1b. However, the presence of the macroscopic magnetic field 14 hardly contributes to local field variations caused by the presence of absence of magnetic material and therefore hardly influences the magnetic field variations sensed by the sensor 21. Non-uniformities (not shown) in the magnetized ferromagnetic material 8 in the stabilizing layer 15*a* may contribute to local field variations and should be avoided.

The read only magnetic information carrier 1*b* as shown in FIG. 2 may be produced, for example, by applying a stabilizing layer 15*a* (for example, by depositing or sputtering) of ferromagnetic material 8 to the substrate 2. The pattern of magnetic bits 4 of magnetic material are applied to the layer of ferromagnetic material 8. By heating the stabilizing layer 15*a* to above the Curie temperature of the ferromagnetic material 8, the ferromagnetic material 8 achieves a paramagnetic state which enables the domain magnetization direction 13 of the material domains 12 to be changed upon cooling down through the Curie temperature. When an external magnetic field having a magnetic field direction 17 is applied, the magnetization direction 6 of the magnetic bits 4 and the domain magnetization direction 13 of the material domains 12 are both substantially aligned parallel to the external magnetic field, consistent with the ferromagnetic coupling 10 between the magnetic bits 4 and the ferromagnetic material 8. By reducing the temperature of the ferromagnetic material 8 to (far) below the Curie temperature, the domain magnetization directions 13 of the material domains 12 of the ferromagnetic material 8 and the magnetization direction 6 of the magnetic bits are (firmly) fixed, resulting in a stabilizing layer 15*a* comprising permanently magnetized ferromagnetic material 8.

Figure 3A:
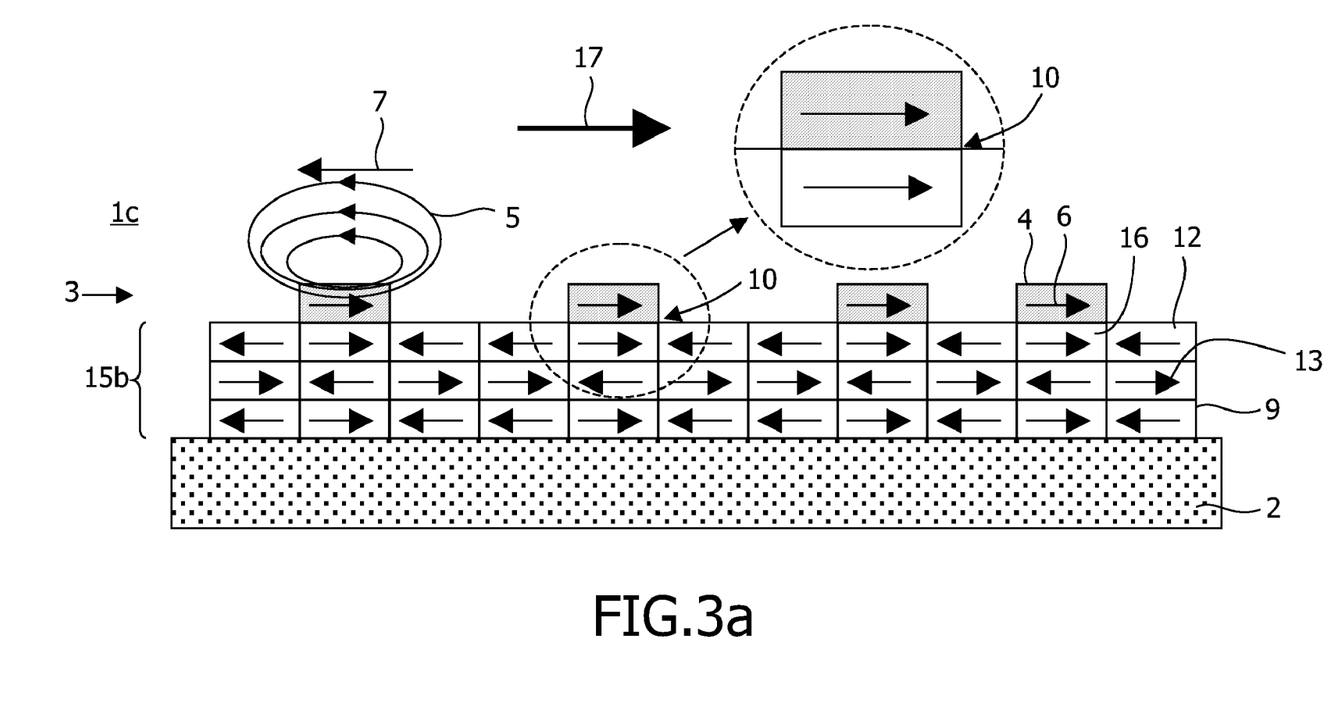
FIG. 3*a* shows the read only magnetic information carrier according to the invention having a ferromagnetic coupling between the magnetic bit and the anti-ferromagnetic material.
Figure 3B:
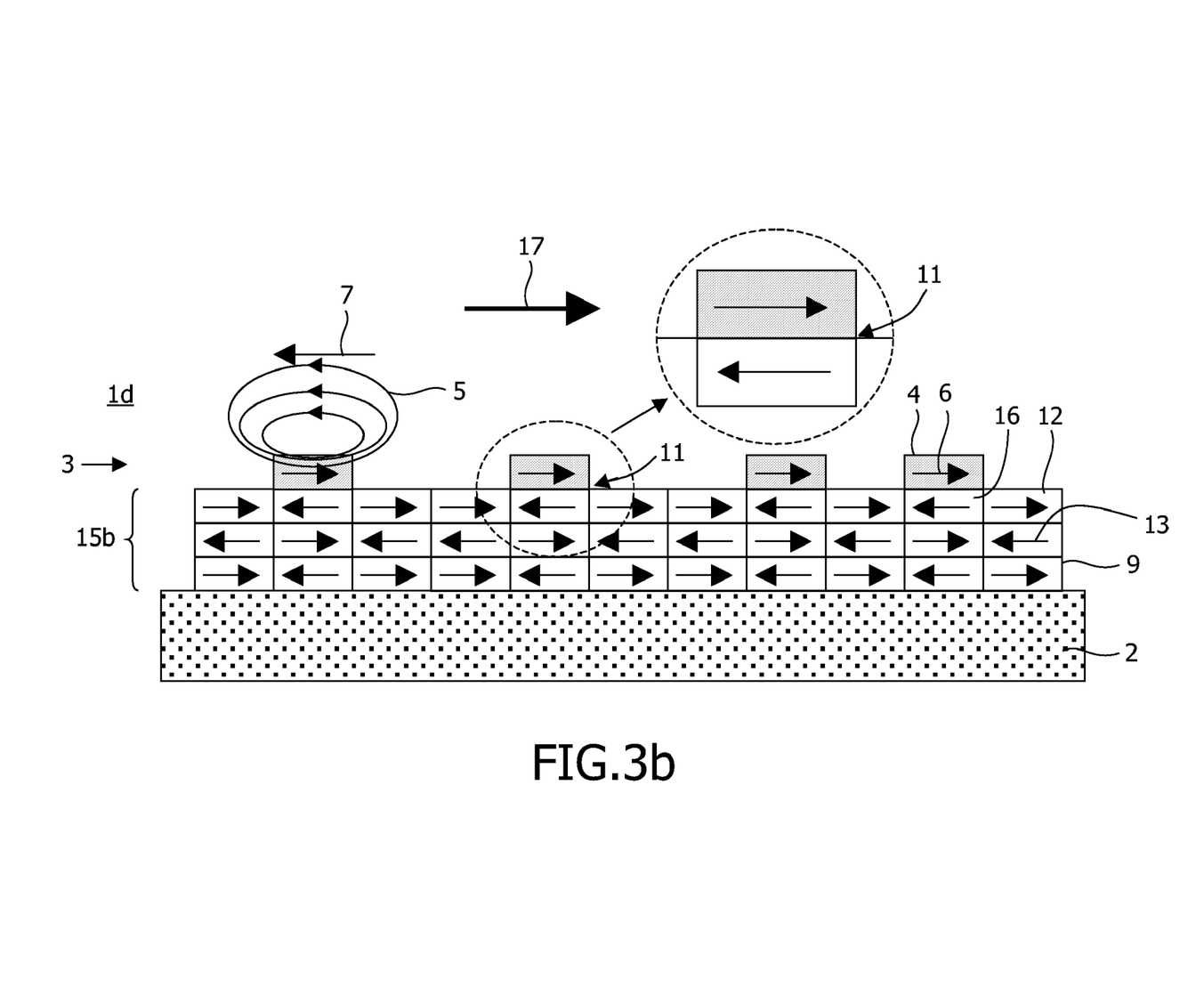
FIG. 3*b* shows the read only magnetic information carrier according to the invention having an anti-ferromagnetic coupling between the magnetic bit and the anti-ferromagnetic material.

FIGS. 3*a* and 3*b* show a highly simplified representation of the read only magnetic information carrier 1*c*, 1*d*, according to the invention having a stabilizing layer 15*b* which comprises anti-ferromagnetic material 9, wherein FIG. 3*a* shows a ferromagnetic coupling 10 between the magnetic bit 4 and the anti-ferromagnetic material 9 and wherein FIG. 3*b* shows an anti-ferromagnetic coupling 11 between the magnetic bit 4 and the anti-ferromagnetic material 9.

Anti-ferromagnetic material 9 is constituted by permanently magnetized material domains 12, wherein each material domain 12 comprises a small volume of magnetized anti-ferromagnetic material 9 which comprises a net domain magnetization direction 13. At a temperature below a Néel temperature the material domains 12 of the anti-ferromagnetic material 9 are arranged such that the domain magnetization direction 13 of each material domain 12 is aligned anti-parallel to the domain magnetization direction 13 of a neighbor magnetic domain 12. Thus, a macroscopic magnetic field of the stabilizing layer 15*b* which is constituted by anti-ferromagnetic material is substantially zero, even below the Néel temperature. The magnetic bits 4 are magnetically coupled 10, 11 to adjacent material domains 16 of the anti-ferromagnetic material 9. The coupling between the magnetic bit 4 and the adjacent material domains 16 can be ferromagnetic 10 or anti-ferromagnetic 11. The type of coupling which will occur between the magnetic bits 4 and the anti-ferromagnetic material 9 depends on the used material combinations of the magnetic bits 4 and the anti-ferromagnetic material 9. When the magnetic bits 4 are magnetically coupled with the anti-ferromagnetic material 9, the domain magnetization directions 13 of the adjacent material domains 16 secure the magnetization direction 6 of the magnetic bits 4 and thus secure the magnetic field 5 having the predetermined magnetic field direction 7 of the magnetic bits 4, improving the stability of the magnetic bits 4.

The anti-ferromagnetic material 9 in the stabilizing layer 15*b*, for example, is a continuous layer in the stabilizing layer 15*b*, or, for example, is only present in a stabilizing pattern (not shown) at the locations where magnetic bits 4 are present in the information layer 3. The functional effect of the anti-ferromagnetic material 9 is that it is magnetically coupled to the magnetic bits 4 and that the increase in bit volume due to the magnetic coupling 10, 11 is sufficient to increase the stability.

FIG. 3*a* shows a read only magnetic information carrier 1*c* in which the coupling between the magnetic bits 4 and the adjacent material domains 16 of the anti-ferromagnetic material 9 is ferromagnetic 10. The net domain magnetization direction 13 of the adjacent material domains 16 in the anti-ferromagnetic material 9 is substantially parallel to the magnetization direction 6 of the magnetic bits 4.

FIG. 3*b* shows a read only magnetic information carrier 1*d* in which the coupling between the magnetic bits 4 and the adjacent material domains 16 of the anti-ferromagnetic material 9 is anti-ferromagnetic 11. The net domain magnetization direction 13 of the adjacent material domains 16 in the anti-ferromagnetic material 9 is substantially anti-parallel to the magnetization direction 6 of the magnetic bit 4.

The read only magnetic information carrier 1*c*, 1*d* as shown in FIGS. 3*a* and 3*b* may be produced, for example, by applying a stabilizing layer 15*b* of anti-ferromagnetic material 9, for example, $Cr_2O_3$, NiO or MnO, to the substrate 2. The pattern of magnetic bits 4 of magnetic material are applied to the layer of anti-ferromagnetic material 9. By heating the stabilizing layer 15*b* above the Néel temperature of the anti-ferromagnetic material 9, the anti-ferromagnetic material 9 achieves a paramagnetic state which enables the domain magnetization direction 13 of the material domains 12 to be changed. When an external magnetic field substantially having the magnetic field direction 17 is applied, the magnetization direction 6 of the magnetic bits 4 tends to align parallel to the external magnetic field. The magnetic coupling 10, 11 between the magnetic bits 4 and the adjacent material domains 16 of the anti-ferromagnetic material 9 forces the net domain magnetization direction 13 of the adjacent material domains 16 to substantially align to the magnetization direction 6 of the magnetic bits 4 during the cooling down to below the Néel temperature. Depending on the anti-ferromagnetic material 9 used in the stabilizing layer 15*b* and the magnetic material used in the magnetic bits 4, the net domain magnetization direction 13 of the adjacent material domains 16 align parallel to the magnetization direction 6 of the magnetic bit 4, resulting in a ferromagnetic coupling 10, or align anti-parallel to the magnetization direction 6 of the magnetic bit 4, resulting in an anti-ferromagnetic coupling 11. By reducing the temperature of the anti-ferromagnetic material 9 below the Néel temperature, the material domains 12 of the anti-ferromagnetic material 9 are arranged such that the domain magnetization direction 13 of each material domain 12 is substantially aligned anti-parallel to the domain magnetization direction 13 of a neighbor magnetic domain 12, even with the external magnetic field present. The magnetization direction 6 of the magnetic bits 4 forces the domain magnetization directions 13 of the adjacent material domains 16 to remain substantially parallel or anti-parallel (depending on the used materials) to the magnetization direction 6 of the magnetic bit 4 during the reduction of the temperature to below the Néel temperature. This secures the domain magnetization direction 13 of the adjacent material domains 16 in the anti-ferromagnetic material 9 which secures the magnetization direction 6 of the magnetic bit 4.

Figure 4:
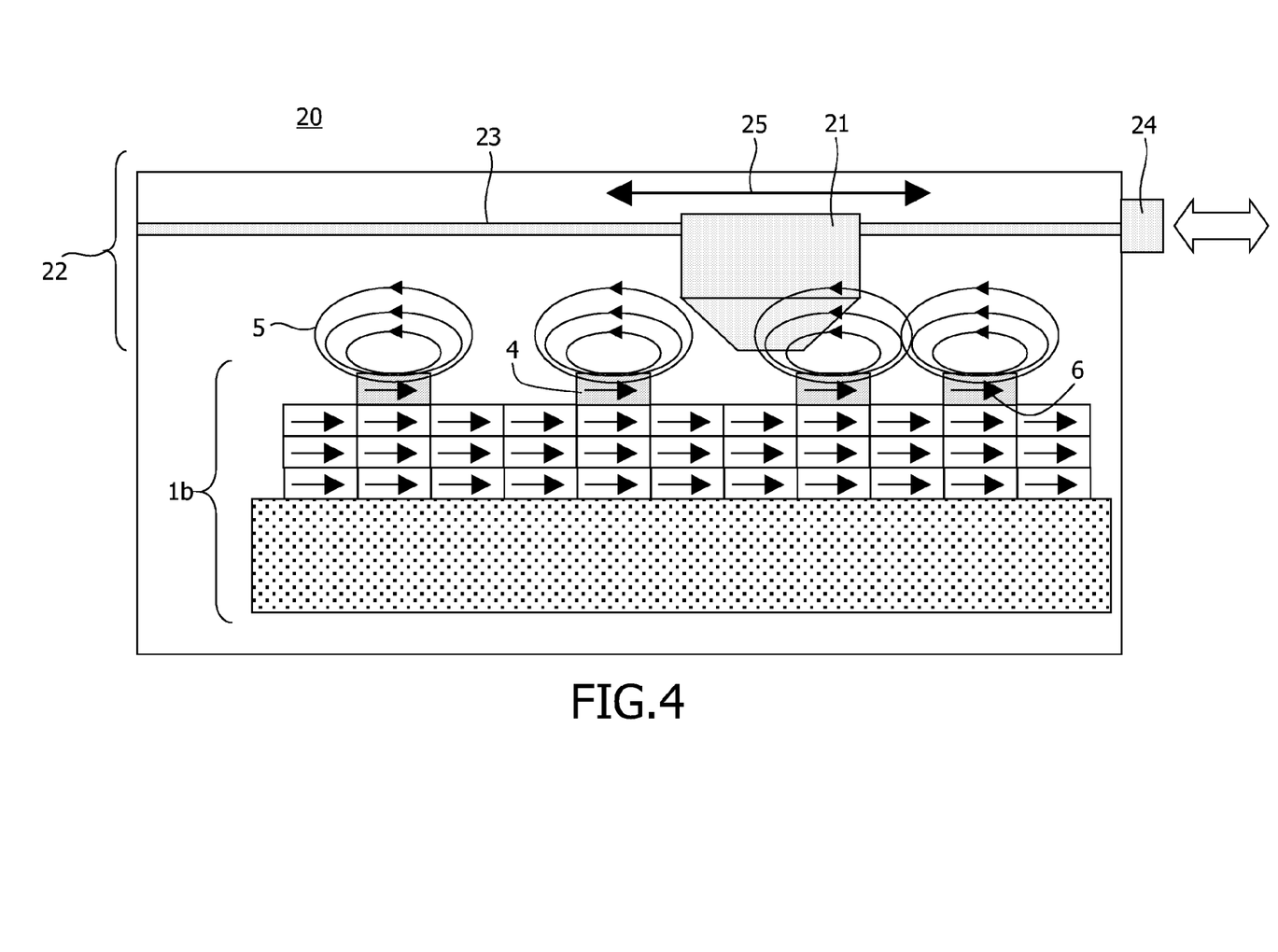
FIG. 4 shows the storage device according to the invention.

FIG. 4 shows the storage device 20 according to the invention. The storage device 20 comprises a read only magnetic information carrier 1*b* and a read out part 22. The read out part 22 comprises a sensor 21, a scanning system 23 and a connector 24. The scanning system 23 comprises, for example, a motor for rotating the read only magnetic information carrier 1b across the sensor, or, for example, a rail for scanning the sensor 21 across the read only magnetic information carrier 1b, or, for example, a rail for scanning the read only magnetic information carrier 1b across the sensor. The sensor 21, for example, senses the magnetic field of the bits 4 through the magnetoresistance phenomenon in which the magnetic field provided by the bits 4 together with the magnetic field direction determine a resistance in the sensor 21. The sensor 21, for example, may also be insensitive to the direction of the magnetic field provided by the magnetic bits and, for example, only sense the presence or absence of a magnetic field. The sensor 21, for example, moves along the scanning system 23 and senses the presence or absence of the magnetic bits 4 by scanning across the magnetic bits 4 of the read only magnetic information carrier 1b. In the example shown in FIG. 4, the scanning system 23 is also used to provide the data retrieved by the sensor 21 to a connector 24. Via the connector 24, the data can be provided to any other electronic equipment, such as, a personal computer, a video game, a mobile phone, etc.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A read only magnetic information carrier comprising:
   a substrate;
   an information layer comprising a pattern of magnetic bits of magnetic material, the pattern of magnetic bits constituting an array of bit locations wherein some of the bit locations have magnetic material present and some of the bit locations have an absence of magnetic material and wherein the presence or absence of the magnetic material at a bit location represents a value of the bit location by a magnetic field having a predetermined magnetic field direction, wherein the predetermined magnetic field direction of the magnetic bits is parallel to the surface of the substrate; and
   a stabilizing layer between the substrate and the information layer, the stabilizing layer comprising hard magnetic material that is magnetically coupled to the magnetic material of the magnetic bits, wherein the magnetization of the stabilizing layer is aligned parallel to the predetermined magnetic field direction of the magnetic bits for providing the predetermined magnetic field direction of the magnetic field;
   wherein the magnetic coupling prevents the magnetic field direction of the magnetic bits from changing, which secures the predetermined magnetic field direction of the magnetic field of the magnetic bits;
   wherein the magnetic bits of the information layer are directly adjacent to the stabilizing layer.

2. A read only magnetic information carrier as claimed in claim 1, wherein the magnetic bits are constituted by magnetized hard magnetic material.

3. A read only magnetic information carrier as claimed in claim 1, wherein the hard magnetic material in the stabilizing layer is constituted by magnetized ferromagnetic material.

4. A read only magnetic information carrier as claimed in claim 3, wherein the magnetic bits are constituted by soft magnetic material.

5. A storage device comprising a read-out part and the read only magnetic information carrier as claimed in claim 1, the read-out part comprising a sensor for sensing the presence or absence of magnetic material at a bit location by the magnetic field having the predetermined magnetic field direction.

6. A read only magnetic information carrier comprising:
   a substrate;
   a stabilizing layer formed on a surface of the substrate, the stabilizing layer comprising a magnetic material, wherein the stabilizing layer is magnetized parallel to a surface of the substrate; and
   a pattern of magnetic bits of magnetic material magnetically coupled to and directly adjacent to the stabilizing layer and defining an array of bit locations in which some of the bit locations have magnetic material present and some of the bit locations have an absence of magnetic material, and wherein each magnetic bit has the same predetermined magnetic field direction, the predetermined magnetic field direction being parallel to the magnetization direction of the stabilizing layer;
   wherein the presence or absence of the magnetic material at a bit location represents a logic value of the respective bit location; and
   wherein the magnetic bits are magnetically coupled to the stabilizing layer so as to increase the bit volume of each magnetic bit, the bit volume of a magnetic bit being the volume of magnetic material which constitutes the magnetic bit and wherein the magnetic coupling prevents the magnetic field direction of the magnetic bits from changing, which secures the predetermined magnetic field direction of the magnetic field of the magnetic bits.

7. The read only magnetic information carrier of claim 6, wherein the stabilizing layer is a hard magnetic material that comprises a ferromagnetic material and wherein the magnetic coupling between the ferromagnetic material of the stabilizing layer and the magnetic bits is ferromagnetic.

8. The read only magnetic information carrier of claim 6, wherein the stabilizing layer comprises an anti-ferromagnetic material and wherein the magnetic coupling between the anti-ferromagnetic material of the stabilizing layer and the magnetic bits is ferromagnetic.

9. The read only magnetic information carrier of claim 6, wherein the stabilizing layer comprises an anti-ferromagnetic material and wherein the magnetic coupling between the anti-ferromagnetic material of the stabilizing layer and the magnetic bits is anti-ferromagnetic.

10. A read only magnetic information carrier comprising:
    a substrate;
    a stabilizing layer formed on a surface of the substrate, the stabilizing layer comprising a magnetic material, wherein the stabilizing layer is magnetized parallel to a surface of the substrate; and
    a pattern of magnetic bits of magnetic material magnetically coupled to and directly adjacent to the stabilizing layer and defining an array of bit locations in which some of the bit locations have magnetic material present and some of the bit locations have an absence of magnetic material, and wherein each magnetic bit has the same predetermined magnetic field direction, the predetermined magnetic field direction being parallel to the magnetization direction of the stabilizing layer;

wherein the presence or absence of the magnetic material at a bit location represents a value of the respective bit location; and wherein the magnetic coupling prevents the magnetic field direction of the magnetic bits from changing, which secures the predetermined magnetic field direction of the magnetic field of the magnetic bits.

11. The read only magnetic information carrier of claim 10, wherein the magnetic material of the stabilizing layer is a hard magnetic material.

12. The read only magnetic information carrier of claim 10, wherein the magnetic material of the stabilizing layer is an anti-ferromagnetic material.

\* \* \* \* \*